United States Patent [19]
Haddon et al.

[11] Patent Number: 5,693,977
[45] Date of Patent: Dec. 2, 1997

[54] N-CHANNEL FIELD EFFECT TRANSISTOR INCLUDING A THIN-FILM FULLERENE

[75] Inventors: Robert Cort Haddon, Dover; Arthur Foster Hebard, Bernardsville; Thomas Theodorus Marie Palstra, New Providence, all of N.J.

[73] Assignee: Lucent Technologies Inc., Murray Hill, N.J.

[21] Appl. No.: 716,829

[22] Filed: Sep. 5, 1996

Related U.S. Application Data

[63] Continuation of Ser. No. 404,221, Mar. 15, 1995, abandoned.

[51] Int. Cl.⁶ .......................... H01L 27/14; H01L 31/00; H01L 29/04; H01L 31/036
[52] U.S. Cl. ................................. 257/431; 257/57
[58] Field of Search ........................ 257/431, 57

[56] References Cited

U.S. PATENT DOCUMENTS

| | | | |
|---|---|---|---|
| 5,009,958 | 4/1991 | Yamashira | 428/411.1 |
| 5,126,283 | 6/1992 | Pintchovski et al. | 437/188 |
| 5,171,373 | 12/1992 | Hebard et al. | 257/431 |

OTHER PUBLICATIONS

J. Kastner et al, "Fullerene Field–Effect Transistors", 1993, Springer Series in Solid–State Sciences, vol. 113, edited by H. Kuzmany et al, pp. 512–515.

*Primary Examiner*—Stephen Meier

[57] ABSTRACT

An n-channel field-effect transistor is fabricated utilizing a thin-film fullerene (for example, $C_{60}$) as the active element. The fullerene film is deposited onto a device substrate in an ultra-high-vacuum chamber and is thus substantially oxygen-free. Subsequently, while still in the chamber, the fullerene film is encapsulated with a material that is impervious to oxygen.

6 Claims, 2 Drawing Sheets

N-CHANNEL FIELD EFFECT TRANSISTOR INCLUDING A THIN-FILM FULLERENE

This is a continuation of application Ser. No. 08/404,221 filed Mar. 15, 1995, now abandoned.

BACKGROUND OF THE INVENTION

This invention relates to thin-film field-effect transistors and, more particularly, to such a transistor that includes a film of fullerene material as the active element thereof.

Organic semiconductors comprising fullerene films have been proposed as the active electronic elements of thin-film field-effect transistors. In this regard, see, for example, "Fullerene Field-Effect Transistors" by J. Kastner et al, *Springer Series in Solid-State Sciences*, edited by H. Kuzmany et al, volume 113, pages 512–513, 1993.

Fullerene field-effect transistors as heretofore proposed have been characterized by a relatively low electron mobility. Thus, for example, in the aforecited Kastner et al article, the electron mobility in the fullerene thin film of the device described therein is specified to be only about $10^{-4}$ centimeter$^2$ per volt-second.

The mobility of electrons in the fullerene film of a field-effect transistor device is in effect a figure of merit of the performance of the device. Accordingly, continuing efforts have been directed at trying to devise fullerene thin films that exhibit higher electron mobilities. It was recognized that such efforts, if successful, could provide a basis for fabricating improved field-effect transistors having advantageous device characteristics suitable for a variety of practical applications.

SUMMARY OF THE INVENTION

In accordance with the principles of the present invention, a fullerene film included in a field-effect transistor as the active element thereof is formed in such a manner that the film is substantially oxygen-free. Thereafter, the film is encapsulated to protect it from exposure to oxygen.

More specifically, a substantially oxygen-free film comprising carbon-cluster molecules each having sixty or more carbon atoms is deposited in an ultra-high-vacuum chamber to form the active element of a field-effect transistor. Subsequently, while the device is still in the ultra-high-vacuum chamber, the film is overlaid with an encapsulating layer that is impervious to oxygen.

In some fabrication sequences carried out in accordance with the principles of the present invention, a layer of an electron-donor material is deposited on the device structure before forming the active fullerene film. In that way, electron mobility in the active film is increased.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
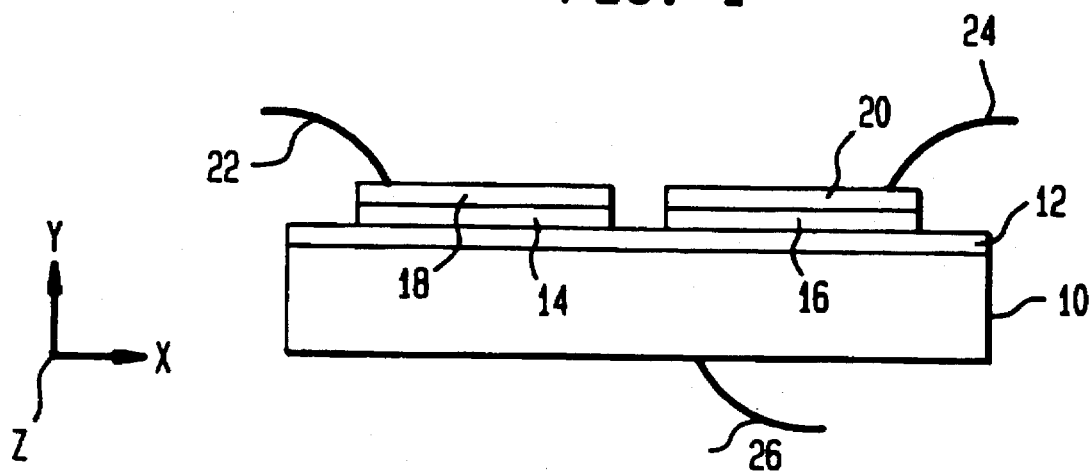
FIG. 1 is an end view of a specific illustrative partially completed thin-film field-effect transistor device structure made in accordance with the principles of the present invention.

FIG. 1 shows a substrate layer 10 on which are to be formed successive layers of a specific illustrative thin-film n-channel field-effect transistor made in accordance with the principles of the present invention. The layer 10 constitutes a conductive substrate. By way of a particular example, the layer 10 comprises a heavily n-doped layer of silicon. Illustratively, the layer 10 is designed to exhibit a resistivity of about 0.01 ohm-centimeter. In one specific device structure, the Y-direction thickness of the layer 10 is approximately 400 micrometers (µm), and its X-direction and Z-direction dimensions are each about 0.75 centimeters (cm). In the final device structure, the conductive substrate layer 10 will serve as the gate electrode of the field-effect transistor.

A layer 12 of a suitable insulating material is then formed on the entire top surface of the substrate layer 10 of FIG. 1. For example, the layer 12 comprises silicon dioxide. In one illustrative case, the layer 12 of silicon dioxide is formed overlying the silicon substrate layer 10 in a standard wet oxidation step and has a Y-direction thickness of about 3000 Angstrom units.

Subsequently, as indicated in FIG. 1, conductive pads are formed on specified portions of the top surface of the insulating layer 12. This is done utilizing conventional lithographic techniques. Illustratively, each such pad comprises a standard two-layer contact structure. In one particular device, the bottom layers 14 and 16 of the pads each comprises a 250-Angstrom unit-thick layer of chromium, and the top layers 18 and 20 of the pads each comprise a 250-Angstrom unit-thick layer of gold. By way of a specific example, the X-direction extent of each such conductive pad is about 0.25 cm and the Z-direction extent thereof is about 0.5 cm.

In the final device structure, the aforedescribed conductive pads shown in FIG. 1 will serve as the source and drain electrodes of the herein-described field-effect transistor. The X-direction spacing between facing edges of the conductive pads defines the channel length of the transistor. In one specific illustrative device structure, this channel length is approximately ten µm.

Subsequently, contact wires 22 and 24 are repectively attached to the top layers 18 and 20 of the contact pads depicted in FIG. 1. Illustratively, the wire 22 is connected to the top surface of the layer 18 near its left-hand edge, and the wire 24 is connected to the top surface of the layer 24 near its right-hand edge. In that way, there is sufficient top-surface area remaining for a subsequently deposited fullerene film to cover portions of the top surfaces of the layers 18 and 20 without contacting the leads 22 and 24. Another contact wire 26 is attached to the bottom surface of the substrate layer 10. The attachment of the wires 22, 24 and 26 is made, for example, utilizing a standard silver paint or silver epoxy. In the final device structure, the wires 22, 24 and 26 respectively constitute the source, drain and gate leads of the transistor Next, in accordance with a particular feature of the invention, a layer of a conventional electron-donor material such as an amine material is deposited on the entire top surface of the FIG. 1 device structure. Such a layer is shown in FIG. 2 wherein it is designated by reference numeral 28.

Figure 2:
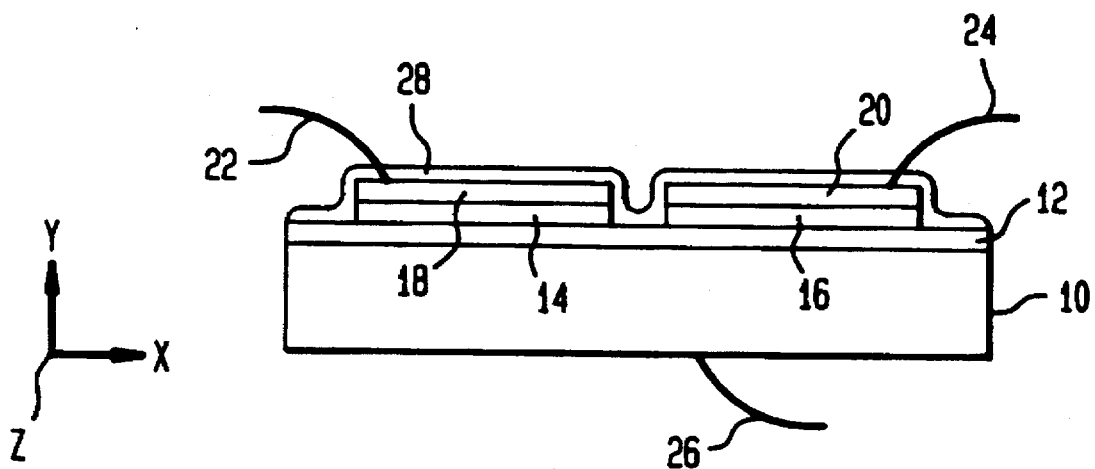
FIG. 2 shows the FIG. 1 structure after an electron-donor layer has been deposited on the top surface thereof.

Various electron-donor materials are suitable for forming the layer 28 of FIG. 2. Thus, for example, the layer 28 may comprise a deposited layer of a known amine material such as tetrakis(dimethylamino)ethylene (TDAE) or diethylene triamine.

In one specific illustrative fabrication sequence carried out in accordance with the principles of the present invention, the device structure shown in FIG. 1 is positioned near the middle of a one-inch-diameter twenty-inch-long glass flow tube. A porcelain boat containing about 0.1-to-0.2 milliliters of TDAE is placed within the tube and near one end thereof. At room temperature, nitrogen gas is then flowed over the boat and along the tube, at a rate, for example, of about one liter of nitrogen per minute, for approximately twelve hours. In that way, TDAE entrained in the nitrogen carrier is flowed over the surface of the device structure. As a result, the layer 28 of TDAE depicted in FIG. 2 is thereby formed.

Next, an organic semiconductor film that will constitute the active element of the field-effect transistor being fabricated is formed on the FIG. 2 structure. In one specific illustrative embodiment of the invention, this formation step is carried out in an ultra-high-vacuum (UHV) chamber that is substantially devoid of oxygen. Additionally, the source that contains the supply of the fullerene material to be formed on the FIG. 2 structure is outgassed before the deposition step is commenced, thereby to remove substantially all oxygen that might be present in the source material. These important steps are necessitated by and based on the inventive discovery that certain fullerenes suitable for inclusion in field-effect transistors are highly susceptible to the presence of oxygen therein. In particular, the presence of oxygen in the active fullerene element of such a transistor is effective to substantially reduce the electron-mobility characteristic of the element and thereby significantly degrade the electrical performance of the transistor.

Accordingly, the device structure shown in FIG. 2 is next placed in a standard UHV chamber for further processing in accordance with the principles of the invention. Illustratively, the structure is baked therein at about 90 degrees Celsius for approximately twelve hours. A final pressure of about $10^{-8}$ Torr is established in the chamber.

Advantageously, the UHV chamber is equipped with a conventional quartz crystal microbalance. With such equipment, the thickness of the fullerene film constituting the active element to be deposited on the FIG. 2 device structure can be accurately monitored.

The thin film constituting the active element is to be deposited on only a specified portion of the top surface of the device structure depicted in FIG. 2. To accomplish that, a standard mask made, for example, of Teflon resin polymer is utilized. Illustratively, the mask comprises a flat sheet having an area approximately the same as the X–Z top-surface area of the FIG. 2 structure. A rectangular cut-out or opening in the mask defines the particular portion of the top surface of the structure on which fullerene material will be deposited to form the active element of the device.

Also, it is advantageous to connect the FIG. 2 device structure in the UHV chamber to a conventional probe connector. By wiring the connector to the source, drain and gate leads 22, 24 and 26, it is possible to monitor the electrical characteristics of the structure as the active element is being formed.

Further, it is usually advantageous to include a standard shutter in the UHV chamber. Quiescently, the shutter serves to cover the cut-out in the aforementioned mask. Once the deposition process is monitored to be proceeding properly, the shutter is opened and fullerene material is thereby allowed to be deposited on the unmasked portion of the top surface of the FIG. 2 device structure.

In accordance with the invention, a known fullerene or carbon-cluster material comprising molecules each having sixty or more atoms arranged in a soccer-ball-like structure is employed to form the active element of a field-effect transistor. Such known materials include $C_{60}$ and higher fullerenes such as $C_{70}$, $C_{76}$, $C_{78}$, $C_{82}$, $C_{84}$ and $C_{90}$.

By way of a specific example, a source containing about 0.1 gram of solid $C_{60}$ material is placed, in a UHV chamber that contains the FIG. 2 device structure. With the chamber pressure at about $10^{-8}$ Torr, the source is established and maintained at approximately 250 degrees Celsius for about twelve hours. This serves to outgas the material in the source, thereby substantially ridding it of any oxygen that might have been present therein.

Thereafter, the temperature of the source in the UHV chamber is raised to about 400 degrees Celsius, thereby to vaporize the fullerene material. Once deposition of the source material is observed to be proceeding properly, the aforementioned shutter is opened and deposition of an undoped film of $C_{60}$ onto the device structure commences. Films produced in this way comprise random polycrystalline grains each having a maximum dimension of about sixty Angstrom units. Significantly, such a film is substantially oxygen-free and functions as an n-type semiconductor in a field-effect transistor exhibiting relatively high electron mobility.

Figure 3:
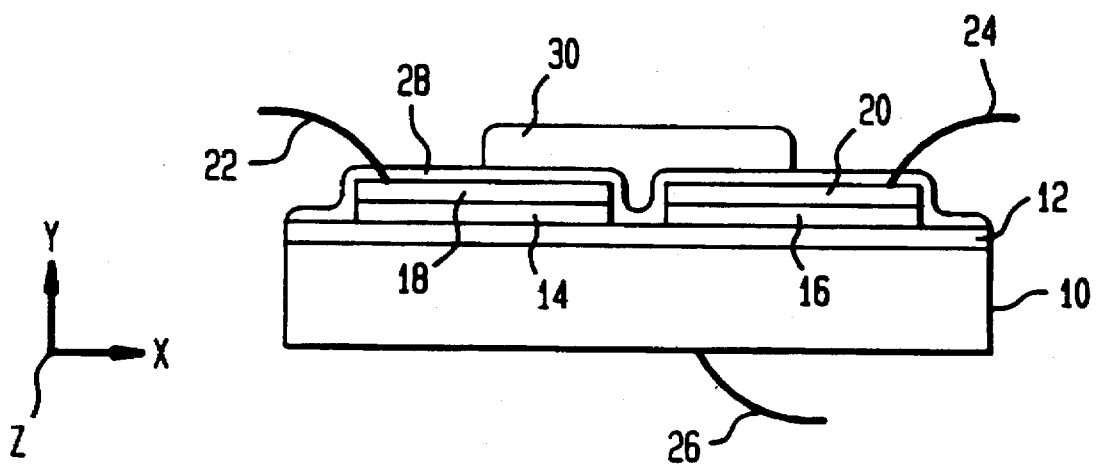
FIG. 3 depicts the FIG. 2 structure after a fullerene film has been formed overlying a specified portion of the top surface.

The fullerene film finally deposited on a specified portion of the FIG. 2 device structure is represented in FIG. 3 wherein it is designated by reference numeral 30. Illustratively, the Y-direction thickness of the film 30 is about 800 Angstrom units.

Figure 4:
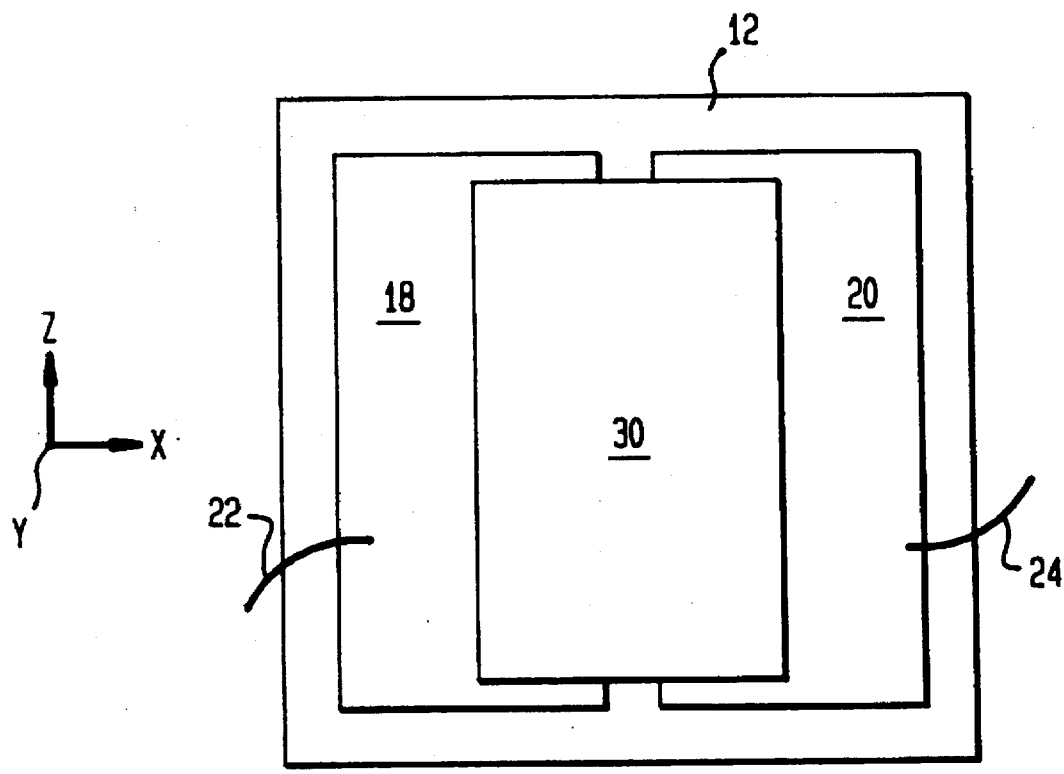
FIG. 4 is a top view of the FIG. 3 structure.

The film 30 is also shown in the top view of FIG. 4. By way of example, the Z-direction extent of the film 30 of FIG. 4 is about 0.4 cm and its X-direction dimension is approximately 0.25 cm. Thus, the channel width in the resulting field-effect transistor will also be about 0.4 cm.

In accordance with the principles of the present invention, it is necessary to protect the deposited film 30 from the effects of oxygen. Thus, before removing the device structure of FIGS. 3 and 4 from the UHV chamber, the film 30 is encapsulated with a protective coating that is impervious to oxygen. Such a protective coating is shown in FIG. 5 wherein it is designated by reference numeral 32.

Illustratively, the encapsulating layer 32 comprises a standard material such as a doped glass, silicon oxide, silicon or parylene. The layer 32 has a Y-direction thickness of, for example, about one μm.

Figure 5:
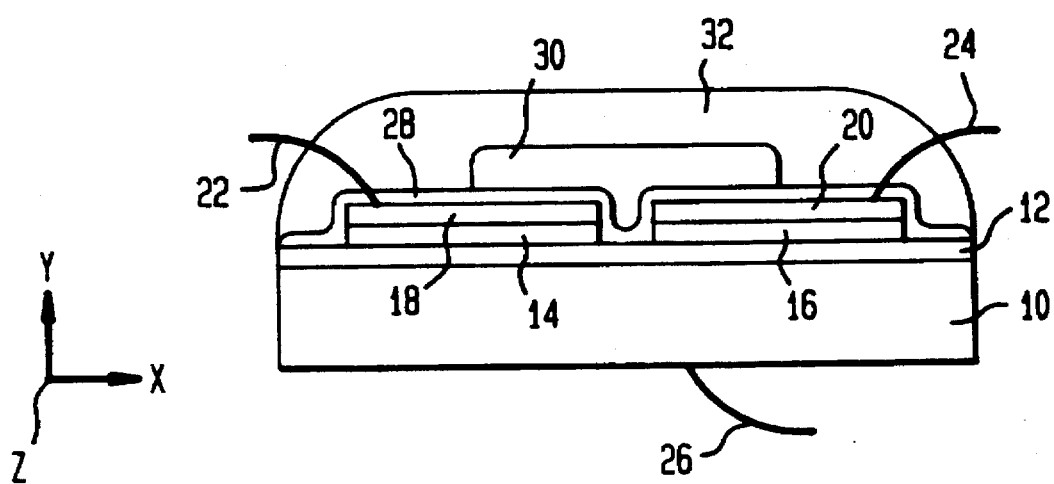
FIG. 5 is an end view of the structure shown in FIGS. 3 and 4 after an encapsulating layer has been added thereto.

The specific illustrative field-effect transistor depicted in FIG. 5 exhibits advantageous electrical characteristics. The thin active film 30 of the device typically exhibits a field-effect electron mobility of about 0.3 centimeter$^2$ per volt-second. Moreover, the ON/OFF ratio of the device (the source-to-drain current at a gate voltage of +10 volts relative to the source-to-drain current at zero gate voltage) is approximately twenty. Further, the threshold voltage of the specific described device (the voltage required to open the channel) is about −2.7 volts.

For some practical applications, it may be advantageous to omit the electron-donor layer 28 from the herein-described field-effect device. Without the layer 28, the active film 30 of such a field-effect device made in accordance with the invention typically exhibits a somewhat reduced electron mobility of about 0.08 centimeter$^2$ per volt-centimeter. But the ON/OFF ratio of such a device without the layer 28 is increased to a value of approximately $10^6$, and the threshold voltage thereof is changed to about +15 volts.

The advantageous electrical characteristics of a field-effect transistor made in accordance with this invention primarily stem from the fact that the active element thereof (the fullerene film) is formed and maintained in a substantially oxygen-free manner. In that way, electron traps formed by oxygen molecules in the lattice of the fullerene material are largely avoided, whereby the electron mobility of the film is thereby significantly enhanced relative to such films in priorly known field-effect devices Finally, it is to be understood that the above-described structures and fabrication techniques are only illustrative of the principles of the present invention. In accordance with these principles, numerous modifications and alternatives may be devised by those skilled in the art without departing from the spirit and scope of the invention. Thus, for example, although emphasis herein has been directed to forming fullerene films in a UHV chamber, it is also feasible in accordance with the invention to form the films by other known oxygen-free deposition processes.

What is claimed is:

1. A thin-film field-effect transistor device, comprising:
    a substantially oxygen-free fullerene film, the fullerene film being an active film of the thin-film field-effect transistor device, wherein the fullerene film has a mobility of at least about 0.08 $cm^2$/volt-second.

2. The thin-film field-effect transistor device of claim 1, wherein the ON/OFF ratio is at least about $10^6$.

3. The thin-film field-effect transistor device of claim 1, wherein the threshold voltage is less than about 15 volts.

4.. The thin-film field-effect transistor device of claim 1, further comprising:
    an electron-donor film in contact with the fullerene film, wherein the fullerene-film has a mobility of at least about 0.3 $cm^2$/volt-second.

5. The thin-film field-effect transistor device of claim 4, wherein the ON/OFF ratio is at least about 20.

6. The thin-film field-effect transistor device of claim 4, wherein the threshold voltage is greater than about 2.7 volts.

* * * * *